United States Patent
Farjadrad

(10) Patent No.: US 12,058,874 B1
(45) Date of Patent: Aug. 6, 2024

(54) UNIVERSAL NETWORK-ATTACHED MEMORY ARCHITECTURE

(71) Applicant: Eliyan Corporation, Santa Clara, CA (US)

(72) Inventor: Ramin Farjadrad, Los Altos, CA (US)

(73) Assignee: Eliyan Corporation, Santa Clara, CA (US)

( * ) Notice: Subject to any disclaimer, the term of this patent is extended or adjusted under 35 U.S.C. 154(b) by 0 days.

(21) Appl. No.: 18/528,702

(22) Filed: Dec. 4, 2023

Related U.S. Application Data

(60) Provisional application No. 63/543,517, filed on Oct. 11, 2023, provisional application No. 63/435,540, filed on Dec. 27, 2022.

(51) Int. Cl.
*H10B 80/00* (2023.01)
*H01L 25/065* (2023.01)
*H01L 25/07* (2006.01)
*H01L 25/075* (2006.01)
*H01L 25/11* (2006.01)

(52) U.S. Cl.
CPC ......... *H10B 80/00* (2023.02); *H01L 25/0652* (2013.01); *H01L 25/072* (2013.01); *H01L 25/0753* (2013.01); *H01L 25/115* (2013.01)

(58) Field of Classification Search
CPC ... H10B 80/00; H01L 25/0652; H01L 25/072; H01L 25/0753; H01L 25/115; H01L 23/50
See application file for complete search history.

(56) References Cited

U.S. PATENT DOCUMENTS

| | | | |
|---|---|---|---|
| 4,334,305 A | 6/1982 | Girardi | |
| 5,396,581 A | 3/1995 | Mashiko | |
| 5,677,569 A | 10/1997 | Choi | |
| 5,892,287 A | 4/1999 | Hoffman | |
| 5,910,010 A | 6/1999 | Nishizawa | |
| 6,031,729 A | 2/2000 | Berkely | |
| 6,055,235 A | 4/2000 | Blanc | |
| 6,417,737 B1 | 7/2002 | Moloudi | |

(Continued)

OTHER PUBLICATIONS

Kurt Lender et al., "Questions from the Compute Express Link Exploring Coherent Memory and Innovative Cases Webinar", Apr. 13, 2020, CXL Consortium, pp. 1-6.

(Continued)

*Primary Examiner* — Phat X Cao
(74) *Attorney, Agent, or Firm* — Lance Kreisman; Peninsula Patent Group

(57) ABSTRACT

Semiconductor devices, packaging architectures and associated methods are disclosed. In one embodiment, a multi-chip module (MCM) is disclosed. The MCM includes a common substrate and a first integrated circuit (IC) chiplet disposed on the common substrate. The first IC chiplet includes at least one processing element. A communications fabric switchably couples to the at least one processing element. A peripheral gearbox chiplet (PGC) includes a first port having a second memory-agnostic interface coupled to the first memory-agnostic interface of the first IC chiplet. The PGC includes a second port having a memory interface of a first type and interface conversion circuitry disposed between the second memory-agnostic interface and the memory interface of the first type.

22 Claims, 8 Drawing Sheets

(56) References Cited

U.S. PATENT DOCUMENTS

| | | |
|---|---|---|
| 6,690,742 B2 | 2/2004 | Chan |
| 6,721,313 B1 | 4/2004 | Van Duyne |
| 6,932,618 B1 | 8/2005 | Nelson |
| 7,027,529 B1 | 4/2006 | Ohishi |
| 7,248,890 B1 | 7/2007 | Raghavan |
| 7,269,212 B1 | 9/2007 | Chau |
| 7,477,615 B2 | 1/2009 | Oshita |
| 7,535,958 B2 | 5/2009 | Best |
| 7,701,957 B1 | 4/2010 | Bicknell |
| 7,978,754 B2 | 7/2011 | Yeung |
| 8,004,330 B1 | 8/2011 | Acimovic |
| 8,024,142 B1 | 9/2011 | Gagnon |
| 8,121,541 B2 | 2/2012 | Rofougaran |
| 8,483,579 B2 | 7/2013 | Fukuda |
| 8,546,955 B1 | 10/2013 | Wu |
| 8,861,573 B2 | 10/2014 | Chu |
| 8,948,203 B1 | 2/2015 | Nolan |
| 8,982,905 B2 | 3/2015 | Kamble |
| 9,088,334 B2 | 7/2015 | Chakraborty |
| 9,106,229 B1 | 8/2015 | Hutton |
| 9,129,935 B1 | 9/2015 | Chandrasekar |
| 9,294,313 B2 | 3/2016 | Prokop |
| 9,349,707 B1 | 5/2016 | Sun |
| 9,379,878 B1 | 6/2016 | Lugthart |
| 9,432,298 B1 | 8/2016 | Smith |
| 9,832,006 B1 | 11/2017 | Bandi |
| 9,886,275 B1 | 2/2018 | Carlson |
| 9,934,842 B2 | 4/2018 | Mozak |
| 9,961,812 B2 | 5/2018 | Suorsa |
| 10,171,115 B1 | 1/2019 | Shirinfar |
| 10,410,694 B1 | 9/2019 | Arbel |
| 10,439,661 B1 | 10/2019 | Heydari |
| 10,642,767 B1 | 5/2020 | Farjadrad |
| 10,678,738 B2 | 6/2020 | Dai |
| 10,735,176 B1 | 8/2020 | Heydari |
| 10,748,852 B1 | 8/2020 | Sauter |
| 10,855,498 B1 | 12/2020 | Farjadrad |
| 10,935,593 B2 | 3/2021 | Goyal |
| 11,088,876 B1 | 8/2021 | Farjadrad |
| 11,100,028 B1 | 8/2021 | Subramaniam |
| 11,204,863 B2 | 12/2021 | Sheffler |
| 11,841,815 B1 | 12/2023 | Farjadrad |
| 11,842,986 B1 | 12/2023 | Ramin |
| 11,855,043 B1 | 12/2023 | Farjadrad |
| 11,855,056 B1 | 12/2023 | Rad |
| 11,893,242 B1 | 2/2024 | Farjadrad |
| 2002/0122479 A1 | 9/2002 | Agazzi |
| 2002/0136315 A1 | 9/2002 | Chan |
| 2004/0088444 A1 | 5/2004 | Baumer |
| 2004/0113239 A1 | 6/2004 | Prokofiev |
| 2004/0130347 A1 | 7/2004 | Moll |
| 2004/0156461 A1 | 8/2004 | Agazzi |
| 2005/0041683 A1 | 2/2005 | Kizer |
| 2005/0134306 A1 | 6/2005 | Stojanovic |
| 2005/0157781 A1 | 7/2005 | Ho |
| 2005/0205983 A1 | 9/2005 | Origasa |
| 2006/0060376 A1 | 3/2006 | Yoon |
| 2006/0103011 A1 | 5/2006 | Andry |
| 2006/0158229 A1 | 7/2006 | Hsu |
| 2006/0181283 A1 | 8/2006 | Wajcer |
| 2006/0188043 A1 | 8/2006 | Zerbe |
| 2006/0250985 A1 | 11/2006 | Baumer |
| 2006/0251194 A1 | 11/2006 | Bublil |
| 2007/0281643 A1 | 12/2007 | Kawai |
| 2008/0063395 A1 | 3/2008 | Royle |
| 2008/0143422 A1 | 6/2008 | Lalithambika |
| 2008/0186987 A1 | 8/2008 | Baumer |
| 2008/0222407 A1 | 9/2008 | Carpenter |
| 2009/0113158 A1 | 4/2009 | Schnell |
| 2009/0154365 A1 | 6/2009 | Diab |
| 2009/0174448 A1 | 7/2009 | Zabinski |
| 2009/0220240 A1 | 9/2009 | Abhari |
| 2009/0225900 A1 | 9/2009 | Yamaguchi |
| 2009/0304054 A1 | 12/2009 | Tonietto |
| 2010/0177841 A1 | 7/2010 | Yoon |
| 2010/0197231 A1 | 8/2010 | Kenington |
| 2010/0294547 A1 | 11/2010 | Hatanaka |
| 2011/0029803 A1 | 2/2011 | Redman-White |
| 2011/0038286 A1 | 2/2011 | Ta |
| 2011/0167297 A1 | 7/2011 | Su |
| 2011/0187430 A1 | 8/2011 | Tang |
| 2011/0204428 A1 | 8/2011 | Erickson |
| 2011/0267073 A1 | 11/2011 | Chengson |
| 2011/0293041 A1 | 12/2011 | Luo |
| 2012/0082194 A1 | 4/2012 | Tam |
| 2012/0182776 A1 | 7/2012 | Best |
| 2012/0192023 A1 | 7/2012 | Lee |
| 2012/0216084 A1 | 8/2012 | Chun |
| 2012/0327818 A1 | 12/2012 | Takatori |
| 2013/0181257 A1* | 7/2013 | Ngai .................. H01L 25/0657 257/209 |
| 2013/0222026 A1 | 8/2013 | Havens |
| 2013/0249290 A1 | 9/2013 | Buonpane |
| 2013/0285584 A1 | 10/2013 | Kim |
| 2014/0016524 A1 | 1/2014 | Choi |
| 2014/0048947 A1 | 2/2014 | Lee |
| 2014/0126613 A1 | 5/2014 | Zhang |
| 2014/0192583 A1 | 7/2014 | Rajan |
| 2014/0269860 A1 | 9/2014 | Brown |
| 2014/0269983 A1 | 9/2014 | Baeckler |
| 2015/0012677 A1 | 1/2015 | Nagarajan |
| 2015/0172040 A1 | 6/2015 | Pelekhaty |
| 2015/0180760 A1 | 6/2015 | Rickard |
| 2015/0206867 A1 | 7/2015 | Lim |
| 2015/0271074 A1 | 9/2015 | Hirth |
| 2015/0326348 A1 | 11/2015 | Shen |
| 2015/0358005 A1 | 12/2015 | Chen |
| 2016/0056125 A1 | 2/2016 | Pan |
| 2016/0071818 A1 | 3/2016 | Wang |
| 2016/0111406 A1 | 4/2016 | Mak |
| 2016/0217872 A1 | 7/2016 | Hossain |
| 2016/0294585 A1 | 10/2016 | Rahman |
| 2017/0317859 A1 | 11/2017 | Hormati |
| 2017/0331651 A1 | 11/2017 | Suzuki |
| 2018/0010329 A1 | 1/2018 | Golding, Jr. |
| 2018/0082981 A1 | 3/2018 | Gowda |
| 2018/0137005 A1 | 5/2018 | Wu |
| 2018/0175001 A1 | 6/2018 | Pyo |
| 2018/0190635 A1 | 7/2018 | Choi |
| 2018/0315735 A1* | 11/2018 | Delacruz .................. H01L 25/16 |
| 2019/0044764 A1 | 2/2019 | Hollis |
| 2019/0058457 A1 | 2/2019 | Ran |
| 2019/0108111 A1 | 4/2019 | Levin |
| 2019/0198489 A1 | 6/2019 | Kim |
| 2020/0257619 A1 | 8/2020 | Sheffler |
| 2020/0373286 A1 | 11/2020 | Dennis |
| 2021/0082875 A1 | 3/2021 | Nelson |
| 2021/0117102 A1 | 4/2021 | Grenier |
| 2021/0181974 A1 | 6/2021 | Ghosh |
| 2021/0183842 A1 | 6/2021 | Fay |
| 2021/0225827 A1 | 7/2021 | Lanka |
| 2021/0258078 A1 | 8/2021 | Meade |
| 2021/0311900 A1 | 10/2021 | Malladi |
| 2021/0365203 A1 | 11/2021 | O |
| 2022/0051989 A1 | 2/2022 | Agarwal |
| 2022/0159860 A1 | 5/2022 | Winzer |
| 2022/0223522 A1 | 7/2022 | Scearce |
| 2023/0039033 A1 | 2/2023 | Zarkovsky |
| 2023/0068802 A1 | 3/2023 | Wang |
| 2023/0090061 A1 | 3/2023 | Zarkovsky |
| 2023/0181599 A1 | 5/2023 | Erickson |

OTHER PUBLICATIONS

Planet Analog, "The basics of SerDes (serializers/deserializers) for interfacing", Dec. 1, 2020, Planet Analog, as preserved by the internet Archive, pp. 1-9.

Block Memory Generator v8.2 LogiCORE IP Product Guide Vivado Design Suite; Xilinx; Apr. 1, 2015.

Universal Chiplet Interconnect Express (UCIe) Specification, Revision 1.1, Version 1.0, Jul. 10, 2023.

Hybrid Memory Cube Specification 2.1, Hybrid Memory Cube Consortium, HMC-30G-VSR PHY, 2014.

(56) References Cited

OTHER PUBLICATIONS

Farjadrad et al., "A Bunch of Wires (BOW) Interface for Inter-Chiplet Communication", 2019 IEEE Symposium on High-Performance Interconnects (HOTI), pp. 27-30, Oct. 2019.

Universal Chiplet Interconnect Express (UCIe) Specification Rev. 1.0, Feb. 24, 2022.

* cited by examiner

UNIVERSAL NETWORK-ATTACHED MEMORY ARCHITECTURE

CROSS-REFERENCE TO RELATED APPLICATIONS

This application is a Non-Provisional that claims priority to U.S. Provisional Application No. 63/435,540, filed Dec. 27, 2022, entitled UNIVERSAL NETWORK-ATTACHED MEMORY (UNAM), and U.S. Provisional Application No. 63/543,517, filed Oct. 11, 2023, entitled UNIVERSAL MEMORY INTERFACE (UMI) WITH HALF-DUPLEX BIDIRECTIONAL D2D & C2C PHYS FOR PACKET-BASED MEMORY TRAFFIC TRANSFER, all of which are incorporated herein by reference in their entirety.

TECHNICAL FIELD

The disclosure herein relates to semiconductor devices, packaging and associated methods.

BACKGROUND

As integrated circuit (IC) chips such as system on chips (SoCs) become larger, the yields realized in manufacturing the chips become smaller. Decreasing yields for larger chips increases overall costs for chip manufacturers. To address the yield problem, chiplet architectures have been proposed that favor a modular approach to SoCs. The solution employs smaller sub-processing chips, each containing a well-defined subset of functionality. Chiplets thus allow for dividing a complex design, such as a high-end processor or networking chip, into several small die instead of one large monolithic die.

When accessing memory, traditional chiplet architectures often employ relatively large and complex on-chip memory interfaces for transferring data between the chiplet and a specific memory type. In some situations, this may result in constraining the chiplet's usage for a variety of applications due to memory type inflexibility.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Semiconductor devices, packaging architectures and associated methods are disclosed. In one embodiment, a multi-chip module (MCM) is disclosed. The MCM includes a common substrate and a first integrated circuit (IC) chiplet disposed on the common substrate. The first IC chiplet includes at least one processing element. A communications fabric integrated into the first IC chiplet switchably couples to the at least one processing element. A peripheral gearbox chiplet (PGC) includes a first port having a second memory-agnostic interface coupled to the first memory-agnostic interface of the first IC chiplet. The PGC includes a second port having a memory interface of a first type and interface conversion circuitry disposed between the second memory-agnostic interface and the memory interface of the first type. By employing a memory-agnostic interface on the first IC chiplet, and enabling memory-related communications to be handled via the communications fabric, specific memory interfaces may be utilized in the off-chip PGC, expanding the available applications for the first IC chiplet. For one embodiment, the communications fabric takes the form of network-on-chip (NoC) circuitry. For some embodiments, the memory-agnostic interface includes a NoC memory access controller (MAC) circuit and a universal die-to-die interface. In some embodiments, the NoC circuit enables communications between the first IC chiplet and the PGC via a packet protocol.

Figure 1:
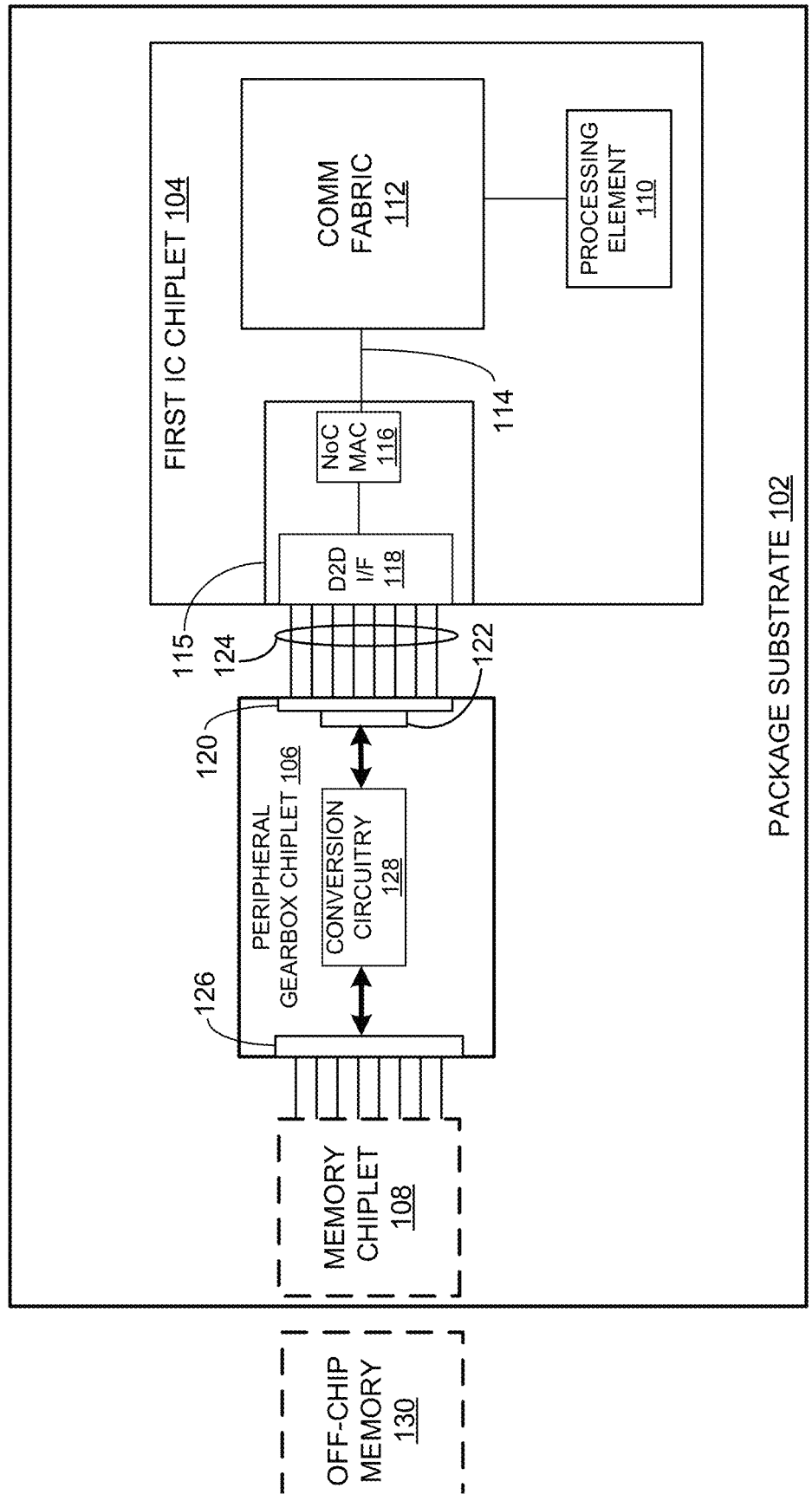
FIG. 1 illustrates a high-level top plan view of a multi-chip module (MCM), including a first integrated circuit (IC) chiplet that is coupled to a memory chiplet via a peripheral gearbox chiplet (PGC).

Throughout the disclosure provided herein, the term multi-chip module (MCM) is used to represent a semiconductor device that incorporates multiple semiconductor die or sub-packages in a single unitary package. An MCM may also be referred to as a system in a chip (SiP). With reference to FIG. 1, a multi-chip module (MCM) is shown, generally designated 100. For one embodiment, the MCM includes a package substrate 102 that serves as a common substrate for a first integrated circuit (IC) chiplet 104, a peripheral gearbox chiplet (PGC) 106 and, for some embodiments, a memory chiplet 108. For some situations, off-chip memory 130 (memory located off of the MCM 100) may be coupled to the PGC 106 in addition to, or as an alternative to the memory chiplet 108. Depending on the application, the various chiplets may be interconnected in a manner that allows for use of a relatively inexpensive non-silicon or organic substrate as the package substrate 102. The use of a non-silicon common substrate 102 avoids size and signaling constraints typically associated with silicon-based substrates. This allows the substrate 102 to be larger, incorporate a more relaxed bump pitch for external interface contacts, and provide low-loss traces. Other embodiments may employ other substrate materials such as silicon-based substrates and/or ceramic or glass-based substrates.

With continued reference to FIG. 1, the first IC chiplet 104 is mounted to the package substrate 102 and may take the form of a computer processing unit (CPU), graphics processing unit (GPU), tensor processing unit (TPU), artificial intelligence (AI) processing circuitry, field-programmable gate array (FPGA) circuitry or other form of host chiplet with a need to access memory. For one embodiment, the first IC chiplet 104 includes at least one processing element 110, such as one or more processor cores. An on-chip communications fabric 112 enables the at least one processing element 110 to communicate on-chip with other various locations throughout the chip, while also providing a way to communicate with the memory chiplet 108 or off-chip memory 130 via a packet-based signaling protocol.

For one embodiment, the on-chip communications fabric 112 comprises network-on-chip (NoC) circuitry. The NoC circuitry 112 generally serves as a form of network router or switch that allows the at least one processing unit 110 to communicate with other on-chip elements or nodes, such as at 114, and further allows the first IC chiplet 104 to cooperate with other NoC circuits that may be disposed in various other IC chiplets or memory chiplets disposed on the MCM 100. Thus, the NoC circuitry 112 is generally capable of transferring and/or receiving data and/or control signals via a packet-switched protocol to any other nodes within the MCM 100 that also have NoC interface circuitry.

Figure 2:
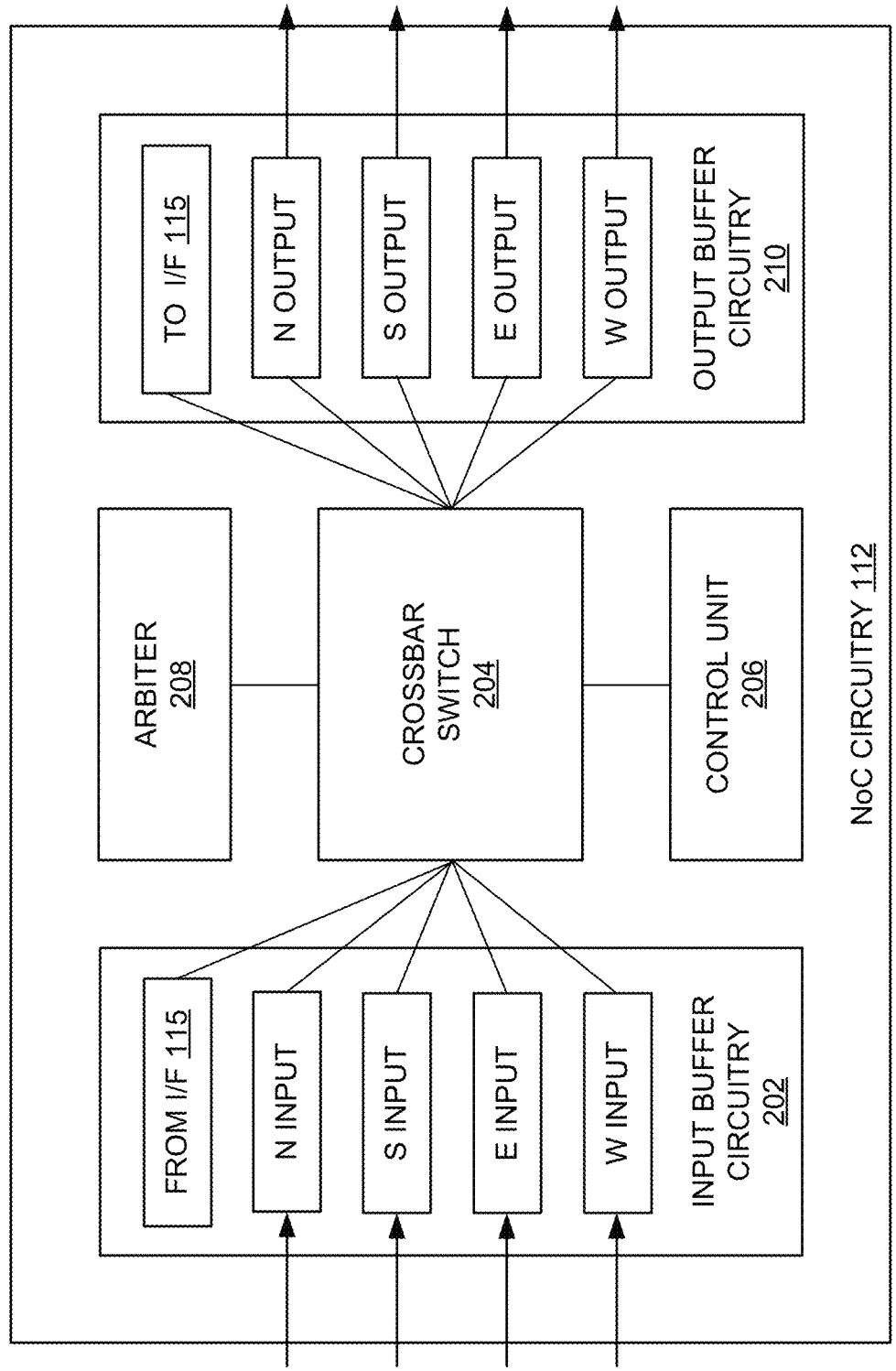
FIG. 2 illustrates one embodiment of the network on chip (NoC) circuitry of FIG. 1.

FIG. 2 illustrates one specific embodiment of the NoC circuitry 112 of FIG. 1. The NoC circuitry 112 includes input buffer circuitry 202 that receives data and/or control signals from a separate NoC circuit associated with another IC chiplet or node on the MCM 100. Depending on how many separate edge interfaces, or ports, are employed by the first IC chiplet 104, the input buffer circuitry 202 may include two (corresponding to, for example, "east" and "west" ports such as those shown in FIG. 2), three, or four queues ("N INPUT", "S INPUT", "E INPUT" OR "W INPUT") to temporarily store signals received from the multiple ports. The input buffer circuitry 202 feeds a crossbar switch 204 that is controlled by a control unit 206 in cooperation with a scheduler or arbiter 208. Output buffer circuitry 210 couples to the crossbar switch 204 to receive data/control signals from the data/control signals from the input buffer circuitry 202 for transfer to a selected output port/interface ("N OUTPUT", "S OUTPUT", "E OUTPUT" OR "W OUTPUT").

Referring back to FIG. 1, for one embodiment, the first IC chiplet 104 includes a memory-agnostic interface 115 that is coupled to the NoC circuitry 112. In one specific embodiment, the memory-agnostic interface 115 includes at least one NoC Memory access controller (MAC) port 116 that transfers information directly with the NoC circuitry 112 via a packet-based protocol. Incoming information received off-chip is converted from a die-to-die communications protocol into the NoC-based packet-protocol by the NoC MAC port 116. The NoC MAC port 116 also allows for converting NoC-based packets generated on-chip into the die-to-die packetized protocol for transfer to another chiplet, such as the PGC 106. In some situations, such as when half-duplex signaling is employed by the PGC 106, the NoC MAC port may detect and control link availability and usage.

Further referring to FIG. 1, the first IC chiplet 104 also includes a memory-agnostic die-to-die (D2D) interface port 118, such as a Universal Chiplet Interconnect express (UCIe) interface or Universal Memory Interface (UMI), that is disposed on an edge of the first IC chiplet 104 and proximate the NoC MAC 116. The D2D interface port 118 transfers the converted die-to-die information associated with the NoC packets via the die-to-die transfer protocol. The NoC MAC 116 and the D2D interface port 118 thus cooperate to transfer data, command and address information that would be transferred by a memory-specific interface, but in a memory-agnostic way. As a result, the first IC chiplet 104 is unencumbered by any specific type of memory interface, and can be applied in a variety of applications that may use a variety of memory types. Various embodiments illustrating the memory-agnostic features of the first IC chiplet 104 are more fully described below.

With continued reference to FIG. 1, while incorporating the NoC MAC port 116 and the D2D interface port 118 provides the first IC chiplet 104 with the memory-agnostic on-chip interface 115 for handling communications between the first IC chiplet 104 and the memory chiplet 108, the use of the NoC MAC port 116 and the D2D interface port 118 also enhances the potential memory-related bandwidth capabilities of the first IC chiplet 104. This is because a given typical memory-specific interface often exhibits an overall footprint that is much larger than the combined footprint achievable with the cooperative NoC MAC port 116 and the D2D interface port 118. Using a memory-agnostic interface such as that described above, each edge of the first IC chiplet 104 can employ a larger number of memory-agnostic ports/interfaces than could be achieved via a standard memory-specific interface, thereby resulting in an increase in memory bandwidth during operation.

Further referring to FIG. 1, for one embodiment, the PGC 106 is mounted to the package substrate 102 and includes a second D2D interface 120 that couples to the D2D interface port 118 of the first IC chiplet 104 via an appropriate set of traces 124 formed in the package substrate 102 or complementary to the package substrate 102, such as through use of a silicon bridge or other form of interconnect with an enhanced trace density. For some embodiments, a second NoC MAC port 122 is also included on the PGC 106. A memory interface of a specific memory type and associated memory controller 126 of the specific memory type (such as DDR, GDDR, LPDDR, HBM, etc.) is incorporated on the PGC 106 to allow for direct memory communications with the memory chiplet 108 of the certain memory type. The memory controller of the specific memory type is also referred to herein as a memory access controller or MAC, and generally coordinates memory transfer operations between the memory chiplet 108 (and/or memory 130) and the first IC chiplet 104. Conversion circuitry 128 disposed in the PGC 106 converts the aggregated non-packetized information provided by the memory-specific interface 126 into a packet format that is compliant with the second D2D interface 122. The conversion circuitry 128 also performs a reverse conversion that transforms the information received from the first IC chiplet 104 in the packetized die-to-die interface protocol into the non-packetized specific memory interface protocol for transfer by the memory-specific interface and controller 126. The PGC 106 thus allows for the memory-specific memory interface and controller 126 to be disposed off of the first IC chiplet 104.

With continued reference to FIG. 1, depending on the application, the memory chiplet 108 may take one of a variety of types. Exemplary memory types may include, for example, double data rate (DDR) dynamic random access memory (DRAM) and related low-power and graphics DDR variants (LPDDR and GDDR), high-bandwidth memory (HBM), compute express link (CXL) memory, and various non-volatile memory variants, to name but a few. Additionally, based on the memory type being employed, the associated memory chiplet 108 may be disposed on the MCM 100 (via a packaged 2.5D or 3.0D configuration with the PGC 106), or off the MCM 100. For some embodiments, at least one memory chiplet 108 may be disposed on the MCM 100, while one or more other memory chips 130 of the same or different memory type may be disposed off of the MCM 100.

While the MCM 100 of FIG. 1 is shown with a single IC chiplet 104, a single PGC 106, and a single memory chiplet/chip 108, the number of memory chiplets 108 that may be available for use with the first IC chiplet 104 may be scaled in a variety of ways, such as through efficient use of the available beachfront area along the edges of the first IC chiplet 104 to allow for multiple PGC 106 and memory chiplet 108 couplings to the first IC chiplet 104. Such embodiments are presented below in further detail.

Figure 3:
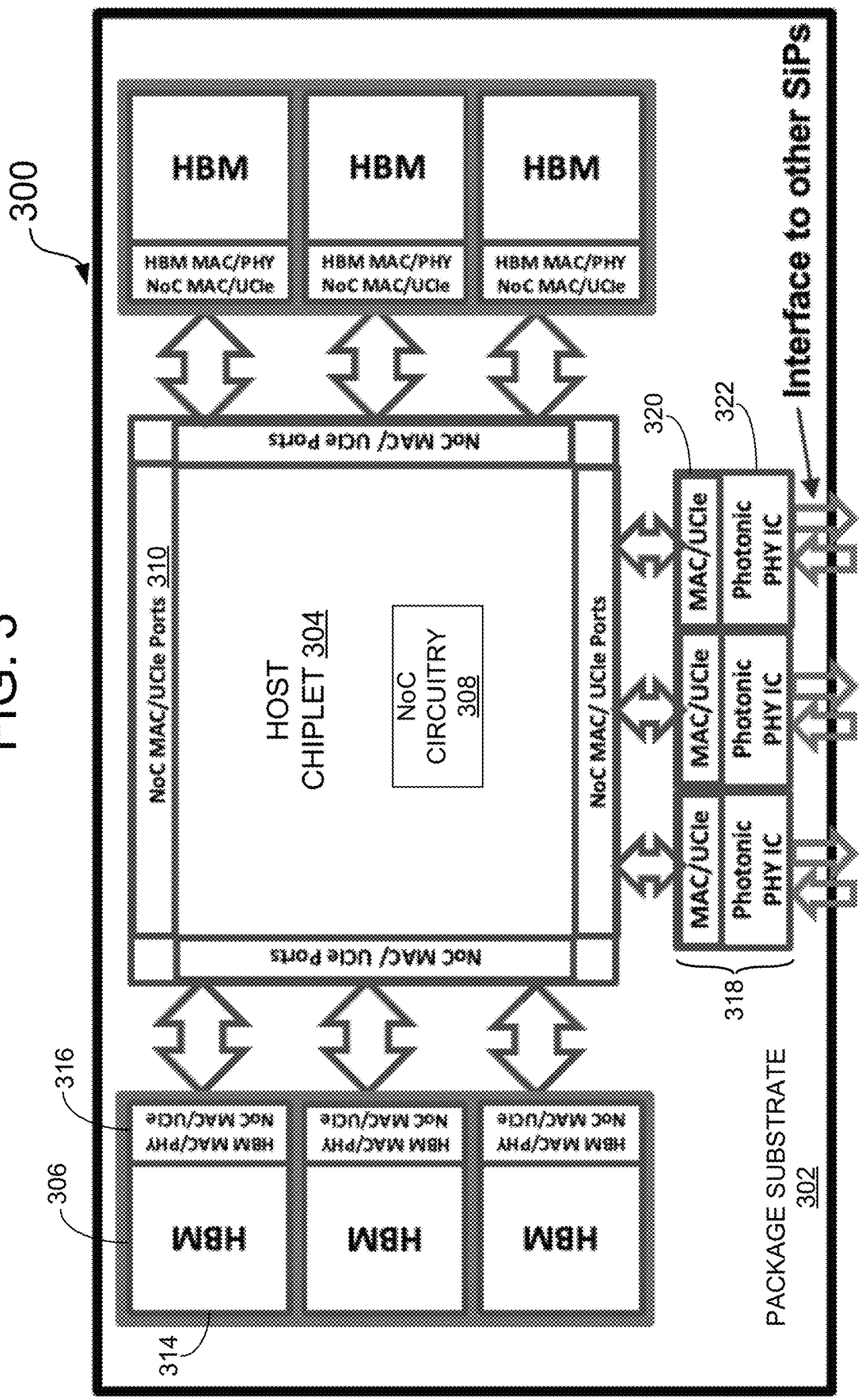
FIG. 3 illustrates a top plan view of one detailed embodiment of the MCM of FIG. 1 that employs high bandwidth memory (HBM) chiplets.

FIG. 3 illustrates one specific embodiment of an MCM, generally designated 300, that employs the generic concepts of the MCM 100 of FIG. 1 in a high-bandwidth memory (HBM) context. A package substrate 302 mounts a host or processor chiplet 304 and multiple HBM memory devices 306. The host chiplet 304 includes NoC circuitry 308 that couples to multiple memory-agnostic interface ports 310, that include multiple NoC MAC ports and corresponding UCIe ports that are disposed along the edges of the host chiplet 304.

Further referring to FIG. 3, each HBM memory device 306 includes HBM memory 314 that is paired with peripheral gearbox circuitry 316 that corresponds to the circuitry employed by the peripheral gearbox chiplet 106 of FIG. 1. The peripheral gearbox circuitry 316 thus includes a UCIe (or any other universal D2D PHY, such as UMI) interface to interact with the UCIe portions of the memory-agnostic interface 310, and a NoC MAC to control the communication. For some embodiments, the peripheral gearbox circuitry 316 also includes an HBM memory access controller MAC and interface to communicate with the HBM memory 314. Various embodiments of the HBM memory device 306 are shown in FIGS. 4A-4C, and are described more fully below.

With continued reference to FIG. 3, for one embodiment, multiple photonic chiplets 318 communicate with a subset of the memory-agnostic interface ports 310 of the host chiplet 304. Each of the photonic chiplets 318 includes logic circuitry 320, similar to the peripheral gearbox circuitry 316, that employs a UCIe interface to interact with the UCIe portions of the memory-agnostic interface 310, and a NoC MAC to control the communication. A photonic IC chip 322 couples to the logic circuitry 320 and communicates with other devices or MCMs (not shown). In some embodiments, the photonic ICs connect to off-chip memory chips or system to communicate memory traffic.

Figure 4A:
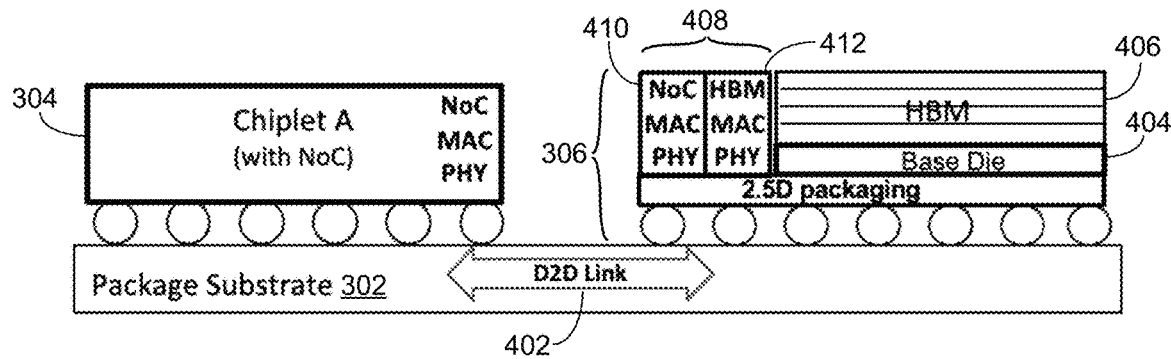
FIGS. 4A-4C illustrate side views of the first IC chiplet and one of the HBM memory chiplets of the MCM of FIG. 3.

FIG. 4A illustrates a cross-sectional view of a portion of the MCM 300, showing one embodiment of one of the HBM memory devices 306 coupled to the host chiplet 304 via a die-to-die link 402 formed in the package substrate 302. The HBM memory device 306 integrates a base die 404 and an HBM memory stack 406 with a peripheral gearbox chiplet 408 in a horizontal manner using a 2.5D packaging technique, such as one that uses a silicon interposer, wafer-level fanout (WLFO) process, or the like. The peripheral gearbox chiplet 408 includes a NoC MAC 410, and an HBM die-to-die (D2D) interface coupled with an HBM memory controller or MAC 412.

Figure 4B:
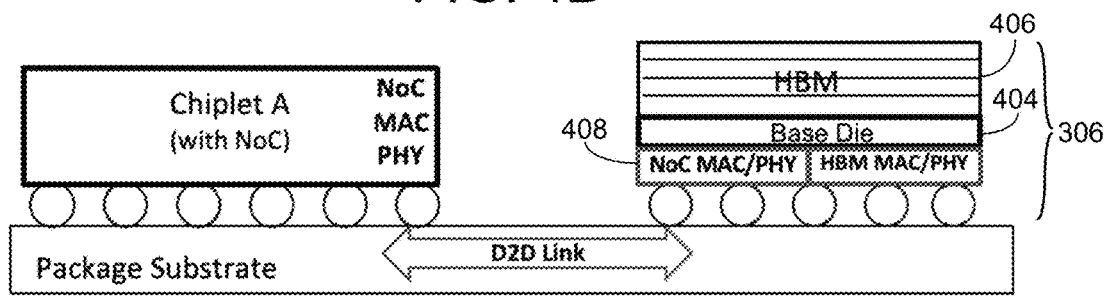
Figure 4C:
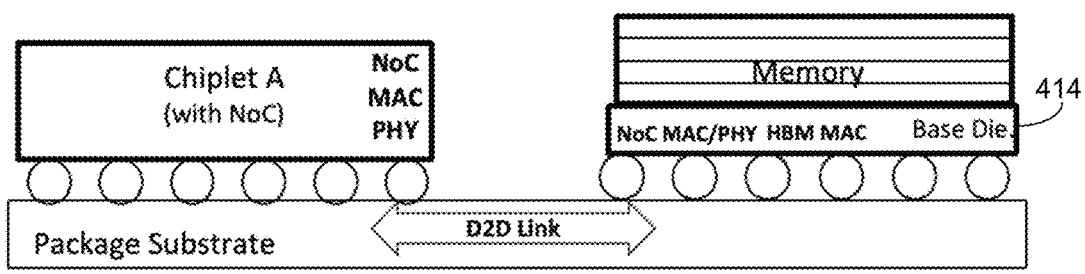

FIG. 4B illustrates a variation of the HBM memory device 306, where the HBM memory stack 406 and the base die 404 are vertically integrated with the peripheral gearbox chiplet 408 in a 3.0 packaging technique, and vertically interconnected using through-silicon via (TSV) technology.

As a further alternative, and referring now to FIG. 4C, if the HBM base die is fabricated by a more advanced logic process, the HBM memory access controller MAC, the D2D interface, and the NoC MAC may be formed in the HBM base die, such as at 414. As a result, the HBM base die in essence becomes a peripheral gearbox die with additional HBM-related functionality. For some embodiments, where the HBM base die and the peripheral gearbox die are combined into one die, then the HBM die-to-die interface may be substituted with a more universal die-to-die interface, such as UCIe.

Figure 5:
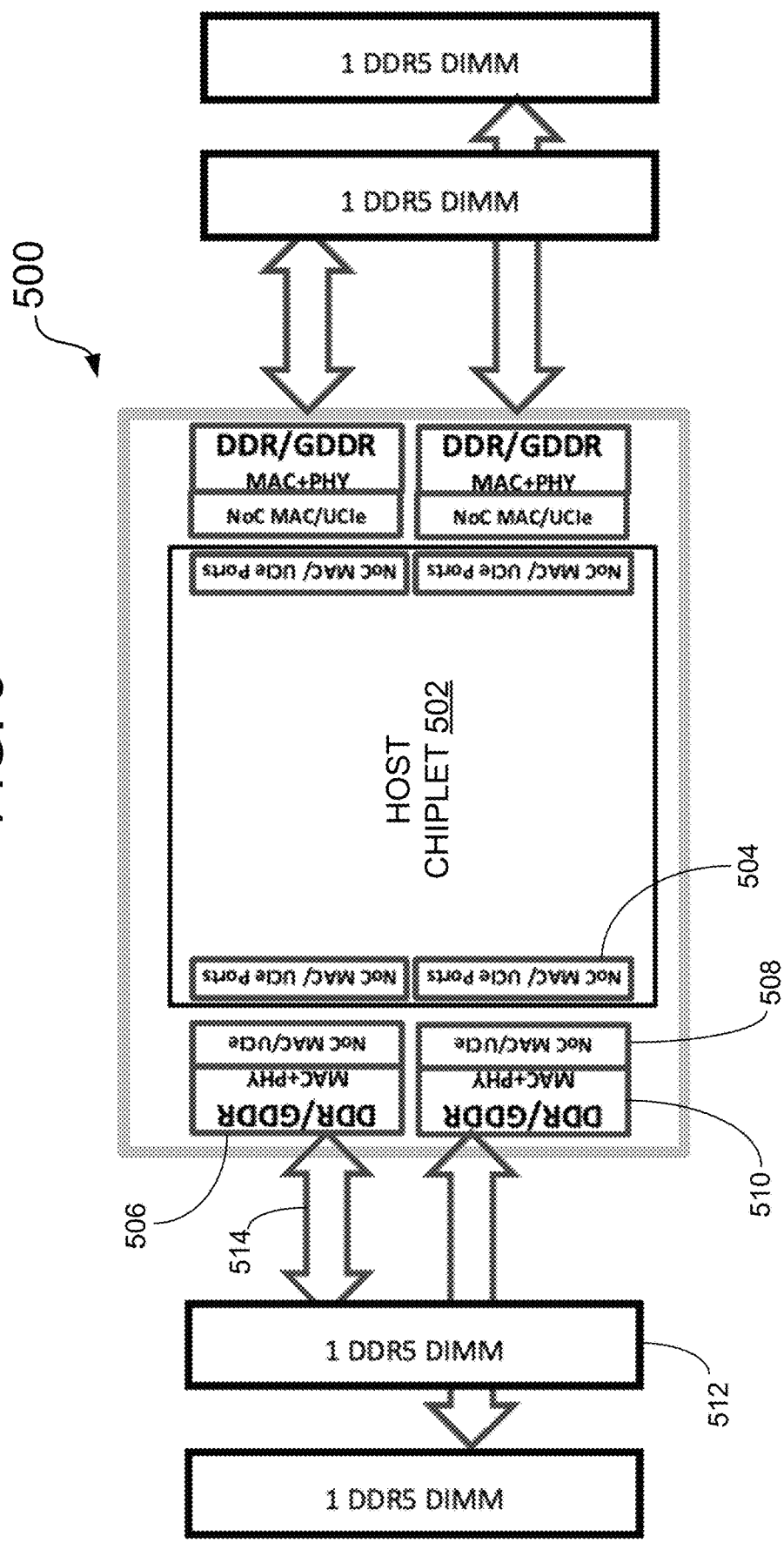
FIG. 5 illustrates a further embodiment of an MCM architecture that is similar to the MCM of FIG. 1, and employing double-data rate (DDR) memory chiplets.

While HBM memory works well for high-bandwidth applications, in certain circumstances, such as for high-capacity situations, double-data rate (DDR) dual inline memory modules (DIMMs) may be the preferred memory of choice for pairing with the MCM 100 (FIG. 1). FIG. 5 illustrates an MCM, generally designated 500, that employs a host or processor chiplet 502 with peripherally-disposed memory-agnostic ports 504 that each include a NOC MAC and a D2D interface such as UCIe. Like the previously-described embodiments, the peripheral ports 504 allow for off-chip memory-agnostic communications between one or more processing elements (not shown) of the host chiplet 502 and other chiplets via a NoC communications fabric (not shown).

Further referring to FIG. 5, a plurality of peripheral gearbox chiplets (PGCs) 506 are disposed on a package substrate, along with the host chiplet 502, proximate a corresponding port 504 of the host chiplet 502. For one embodiment, each of the PGCs 506 include a host interface 508 that includes a NoC MAC and a D2D interface such as UCIe to communicate with each of the memory-agnostic interfaces 504 of the host chiplet 502. Each PGC 506 also includes a memory-specific interface and memory-specific controller circuit 510 that is of a DDR or graphics DDR (GDDR) or low-power DDR (LPDDR) type. For one embodiment, each memory interface and controller circuit 510 is coupled to a DDR or GDDR or LPDDR memory 512 via an appropriate memory bus 514. Using multiple memory interface and controller circuits 510 on the MCM 500 allows for memory capacity expansion that is enhanced by the more efficient beachfront usage by the host chiplet 502 by employing the memory-agnostic interfaces 504 to handle memory access communications.

Figure 6:
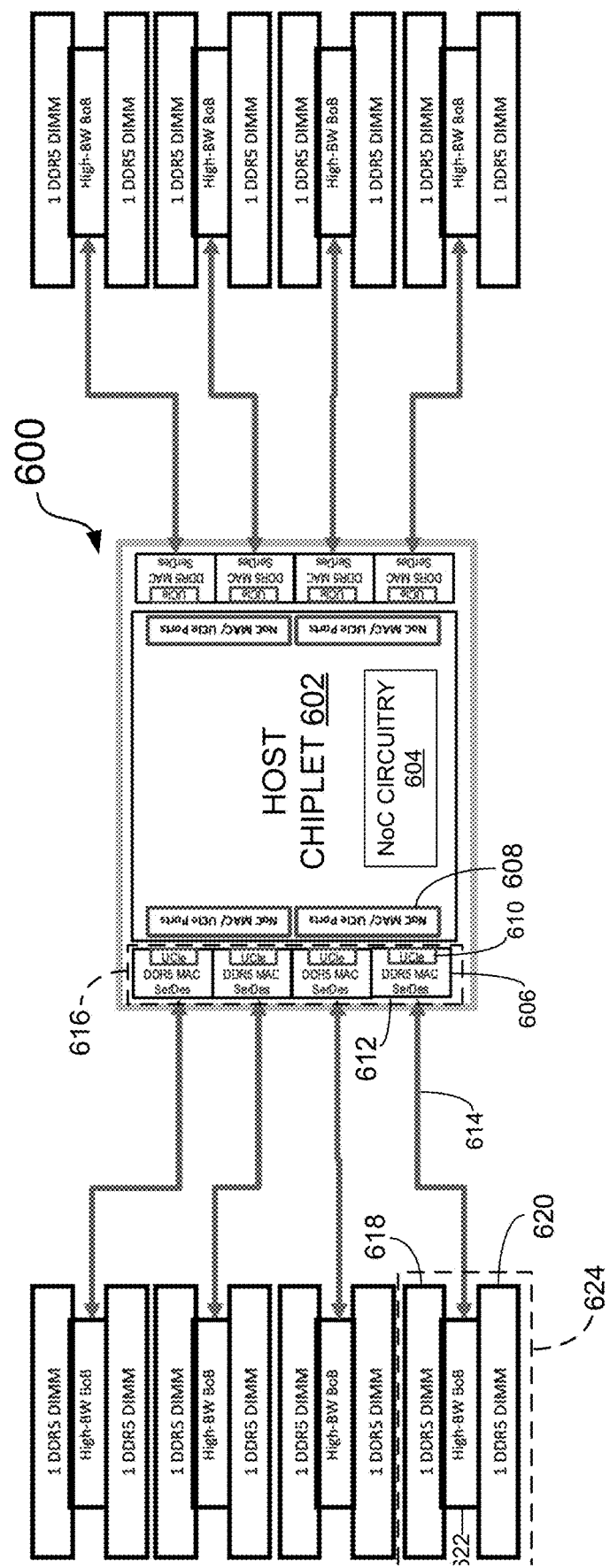
FIG. 6 illustrates an expanded embodiment of an expanded MCM topology for DDR memory chiplets similar to that of FIG. 5.

FIG. 6 illustrates an MCM, generally designated 600, that is similar to the MCM 500 of FIG. 5 in that it includes a host chiplet 602 that includes NoC circuitry 604. The NoC circuitry 604 couples to multiple PGCs 606 via corresponding memory-agnostic interfaces 608 for carrying out memory-related communications. Each PGC 606 includes universal D2D PHY like a UCIe or UMI interface 610 for coupling to a corresponding memory-agnostic interface 608. In an effort to increase memory capacity over the embodiment of FIG. 5, the PGCs 606 include SerDes interface circuitry as a die-to-die interface in addition to a DDR MAC 612.

Further referring to FIG. 6, the Serdes interface circuitry 612 of each PGC 606 couples to a high-speed serial link 614 that uses fewer signaling paths than a full-width memory interface. As a result, for a given MCM beachfront, such as at 616, a larger number of DDR DIMM modules, such as at 618 and 620, may be coupled to the MCM 600. For one embodiment, pairs of DIMMs, such as 618 and 620 are coupled to a common buffer 622 to form a buffer-on-board unit 624.

Figure 7:
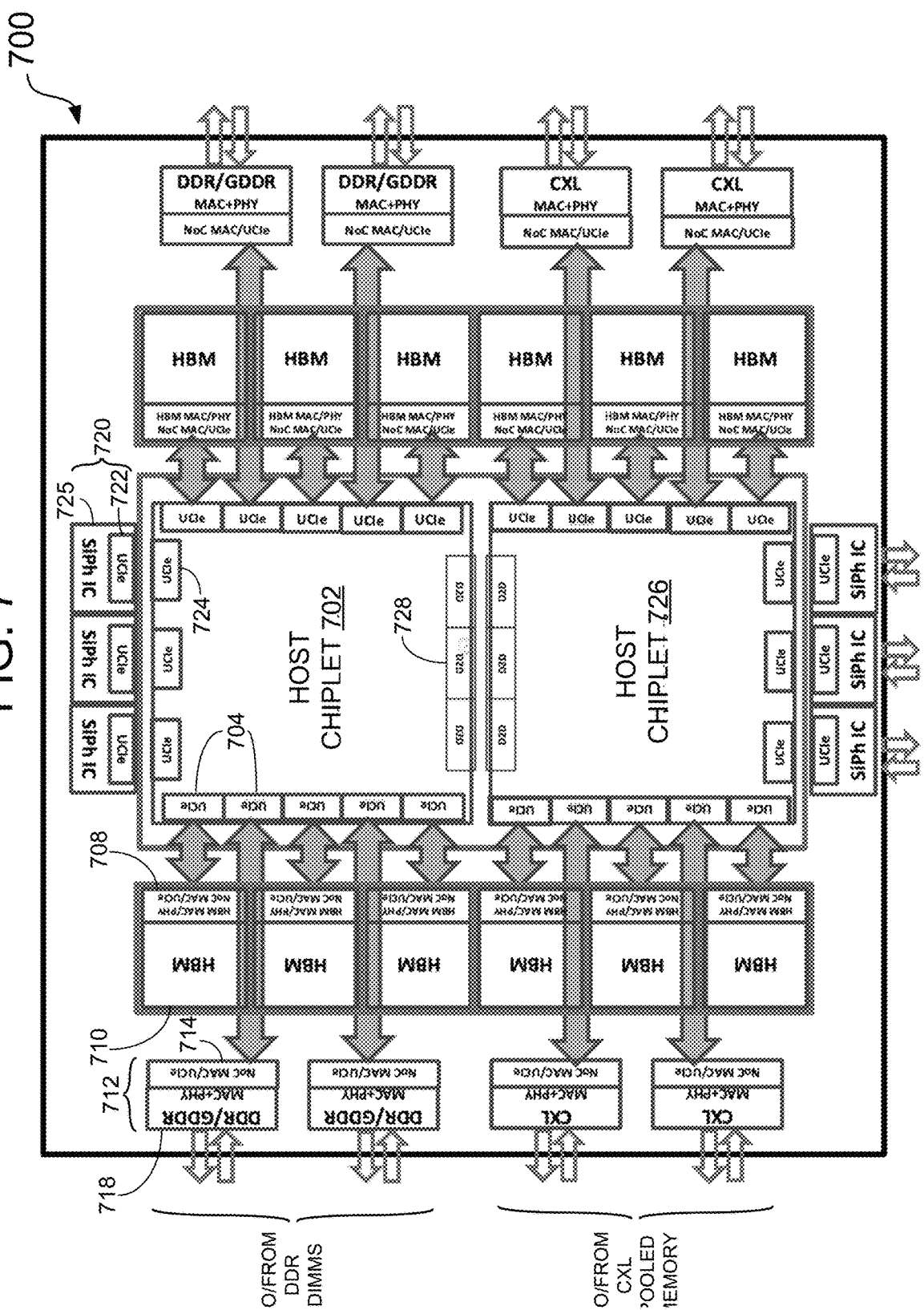
FIG. 7 illustrates one embodiment of a hybrid MCM topology that is similar to FIG. 1, and employing multiple types of memory chiplets.

FIG. 7 illustrates a hybrid MCM 700 that employs different varieties of memory to accomplish correspondingly different goals for different applications. A first host chiplet 702 with a NoC communications fabric (not shown) incorporates multiple memory-agnostic interfaces 704 for coupling to corresponding PGCs. A first type of PGC 708, similar to the PGC 408 shown in FIG. 4A, and specifically configured for HBM memory applications, includes interface circuitry containing a NoC MAC in combination with a universal D2D PHY like a UCIe or UMI interface for coupling to the memory-agnostic interface 704, and an HBM memory access controller MAC and PHY for communicating with an HBM memory device 710. A second type of PGC 712, specifically configured for DDR DIMM memory applications, includes interface circuitry 714 including a NoC MAC with a UCIe interface for coupling to a second memory-agnostic interface 704, and a LPDDR/GDDR/DDR memory access controller MAC and PHY 718 for communicating with remote memory, such as multiple LPDDR/GDDR/DDR memory, or pooled memory associated with a compute express link (CXL) memory architecture.

Further referring to FIG. 7, for one embodiment, the MCM 700 provides high-bandwidth and low-latency connectivity to other computing systems through one or more photonic chiplets 720. Each photonic chiplet 720 includes a die-to-die interface 722 for coupling to a corresponding die-to-die interface 724 on the host chiplet 702, and a photonic IC chip 725. For one embodiment, each of the die-to-die interfaces 722 and 724 include an interface adaptor or NoC MAC. For the embodiment shown in FIG. 7, the host chiplet 702 couples to a second host chiplet 726 via a plurality of die-to-die interfaces 728. The second host chiplet 726 includes similar features as the host chiplet 702, and couples to multiple PGC's to scale the total memory bandwidth by a factor of two. This is but one example of a myriad of combinations that may take advantage of the use of memory-agnostic interfaces 704 in the host chiplets 702 and 726.

Figure 8:
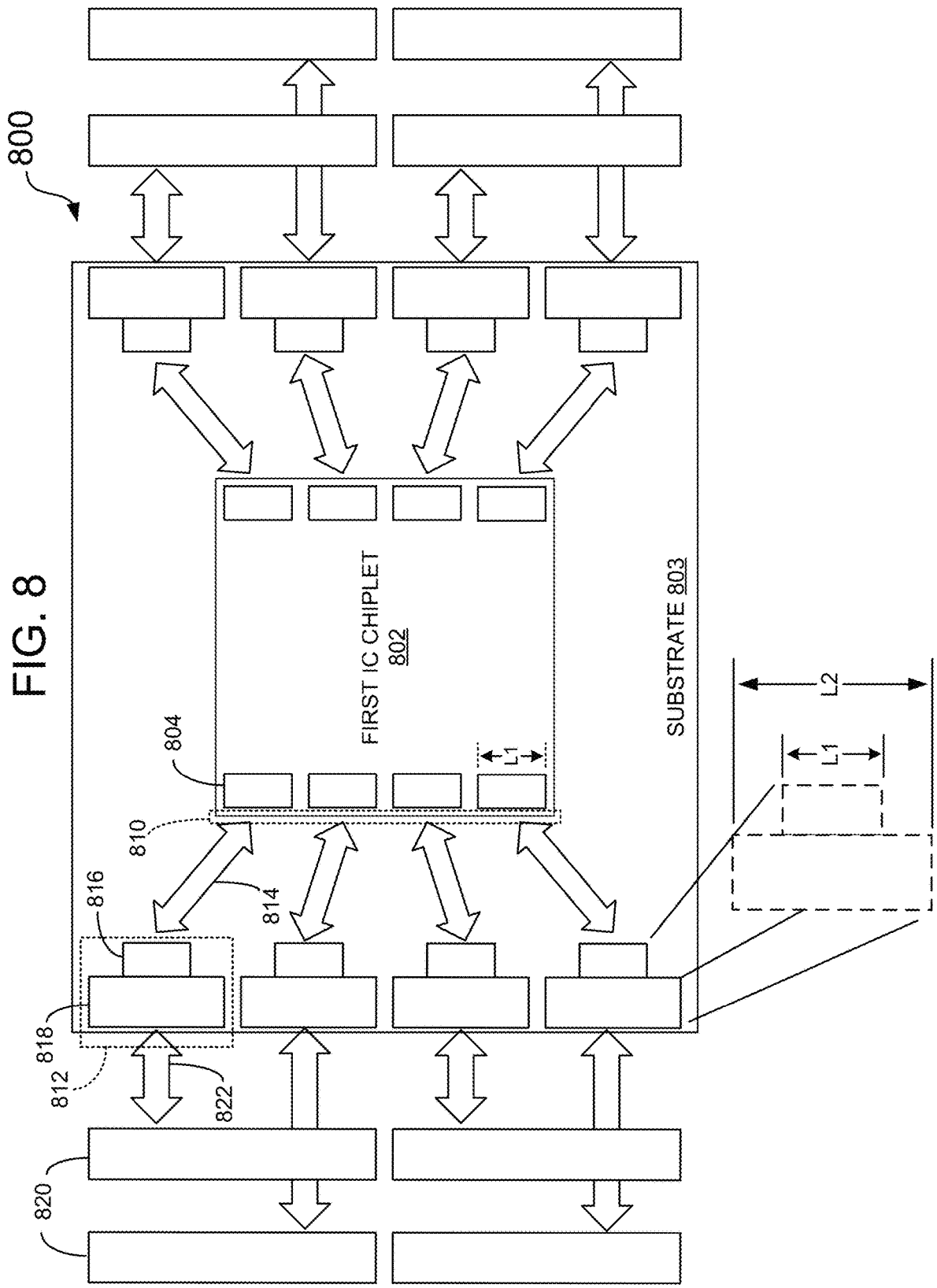
FIG. 8 illustrates a further embodiment of an MCM topology that is similar to FIG. 5, and employing multiple gearbox chiplets.

FIG. 8 illustrates a further embodiment of an MCM topology, generally designated 800, that incorporates many of the features shown in the embodiments described above, and illustrating in further detail how beachfront bandwidth efficiency for a first IC chiplet 802 may be improved through use of memory-agnostic interfaces, such as at 804, to access memory, such as at 820. The first IC chiplet 802 is disposed on a substrate 803 and includes a first edge that defines a beachfront 810 that is of a finite dimension for coupling to the multiple memory-agnostic interfaces 804. Each of the memory-agnostic interfaces 804 includes a NoC MAC and a die-to-die interface, such as a UCIe or UMI interface. The memory-agnostic interface 804 communicates with a first PGC 812 via a set of links 814. For one embodiment, a length L1 of the memory-agnostic interface 804 occupies a relatively small portion of the beachfront 810 of the first IC chiplet 802.

Further referring to FIG. 8, each PGC 812 includes a die-to-die interface 816 that generally matches the die-to-die interface of the memory-agnostic interface 804. Each PGC 812 also includes a memory-specific interface and memory-specific controller circuit 818 that is of a DDR or graphics DDR (GDDR) or low-power DDR (LPDDR) type. For one embodiment, each memory interface and controller circuit 818 is coupled to a DDR or GDDR or LPDDR memory 820 via an appropriate memory bus 822.

With continued reference to FIG. 8, generally, the memory-specific interface and memory-specific controller circuit 818 exhibits a length L2 that is significantly larger than the length L1 of the memory-agnostic interface 804. Consequently, disaggregating multiple memory-specific interface and memory-specific controller circuits 818 off of the first IC chiplet 802 and into multiple PGCs 812, and employing smaller and more space-efficient memory-agnostic interfaces on the beachfront 806 of the first IC chip 802, allows for accessing more memory resources that correspondingly increases a total memory bandwidth by a factor of at least L2/L1.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present disclosure. In some instances, the terminology and symbols may imply specific details that are not required to practice embodiments of the disclosure. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '$\overline{\text{<signal name>}}$') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While aspects of the disclosure have been described with reference to specific embodiments thereof, it will be evident that various modifications and changes may be made thereto without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

I claim:

1. A chiplet-based multi-chip module (MCM), comprising:
   a package substrate;
   a first integrated circuit (IC) chiplet disposed on the package substrate and comprising:
     at least one processing element;
     a communications fabric switchably coupled to the at least one processing element; and
     a first memory-agnostic interface to transfer memory requests from the at least one processing element via the communications fabric;
   a peripheral gearbox chiplet comprising:
     a first port comprising a second memory-agnostic interface coupled to the first memory-agnostic interface of the first IC chiplet;
     a second port comprising a memory interface of a first memory type; and
     interface conversion circuitry disposed between the second memory-agnostic interface and the memory interface of the first memory type, the interface conversion circuitry comprising a memory controller of the first memory type.

2. The chiplet-based MCM of claim 1, wherein:
   the communications fabric comprises a network-on-chip (NoC) circuit.

3. The chiplet-based MCM of claim 2, wherein:
   the first memory-agnostic interface comprises a NoC media access controller (MAC).

4. The chiplet-based MCM of claim 3, wherein:
   the first memory-agnostic interface further comprises a first memory-agnostic die-to-die interface that cooperates with the NOC MAC.

5. The chiplet-based MCM of claim 4, wherein:
   the first memory-agnostic die-to-die interface comprises a universal chiplet interconnect express (UCIe) or Universal Memory Interface (UMI) interface.

6. The chiplet-based MCM of claim 1, further comprising:
   a memory chiplet of the first memory type coupled to the second port of the peripheral gearbox chiplet and disposed on the package substrate.

7. The chiplet-based MCM of claim 6, wherein:
   the memory chiplet of the first memory type is coupled to the second port of the peripheral gearbox chiplet in a 2.5D packaging configuration.

8. The chiplet-based MCM of claim 6, wherein:
   the memory chiplet of the first memory type is coupled to the second port of the peripheral gearbox chiplet in a 3.0D packaging configuration.

9. The chiplet-based MCM of claim 8, wherein:
   the memory interface of the first memory type comprises a high-bandwidth memory (HBM) memory interface; and
   the memory chiplet comprises an HBM chiplet.

10. The chiplet-based MCM of claim 1, wherein:
    the memory interface of the first memory type comprises one of a double-data rate (DDR) memory interface, low-power double data rate (LPDDR) memory interface, a graphics double data rate (GDDR) memory interface or a compute express link (CXL) memory interface.

11. An integrated circuit (IC) chiplet apparatus, comprising:
    a peripheral gearbox chiplet comprising:
      a first port comprising a first memory-agnostic interface to communicate memory-related information with a second memory-agnostic interface of a first IC chiplet, the first memory-agnostic interface comprising
        a network-on-chip (NoC) media access controller (MAC) to communicate with a communications fabric of the first IC chiplet, and
        a first memory-agnostic die-to-die interface that cooperates with the NOC MAC;
      a second port comprising a memory interface of a first memory type; and
      interface conversion circuitry disposed between the first memory-agnostic interface of the first port and the memory interface of the first memory type, the interface conversion circuitry comprising a memory controller of the first memory type.

12. The IC chiplet apparatus of claim 11, wherein:
    the first memory-agnostic interface exhibits a first lateral dimension; and
    wherein the memory interface of the first memory type exhibits a second lateral dimension that is larger than the first lateral dimension.

13. The IC chiplet apparatus of claim 12, wherein:
    the first memory-agnostic die-to-die interface comprises a universal chiplet interconnect express (UCIe) or Universal Memory Interface (UMI) interface.

14. The IC chiplet apparatus of claim 11, further comprising:
    a memory chiplet of the first memory type coupled to the second port of the peripheral gearbox chiplet.

15. The IC chiplet apparatus of claim 14, wherein:
    the memory chiplet of the first memory type comprises a high bandwidth memory (HBM) chiplet.

16. The IC chiplet apparatus of claim 15, wherein:
    the memory chiplet of the first memory type is coupled to the second port of the peripheral gearbox chiplet in a 2.5D packaging configuration.

17. The IC chiplet apparatus of claim 15, wherein:
    the memory chiplet of the first memory type is coupled to the second port of the peripheral gearbox chiplet in a 3.0D packaging configuration.

18. A chiplet-based multi-chip module (MCM), comprising:
    a package substrate;
    a first integrated circuit (IC) chiplet disposed on the package substrate and comprising:
      at least one processing element;
      a communications fabric switchably coupled to the at least one processing element;
      a first memory-agnostic interface to transfer first memory requests from the at least one processing element via the communications fabric; and a second memory-agnostic interface to transfer second memory requests from the at least one processing element via the communications fabric;

a first peripheral gearbox chiplet comprising:
- a first port comprising a second memory-agnostic interface coupled to the first memory-agnostic interface of the first IC chiplet;
- a second port comprising a first memory interface;
- first interface conversion circuitry disposed between the second memory-agnostic interface and the first memory interface; and a second peripheral gearbox chiplet comprising:
- a third port comprising a third memory-agnostic interface coupled to the second memory-agnostic interface of the first IC chiplet;
- a fourth port comprising a second memory interface; and
- second interface conversion circuitry disposed between the third memory-agnostic interface and the second memory interface.

19. The chiplet-based MCM of claim 18, wherein:
the first memory interface comprises a high bandwidth memory (HBM) interface; and
the second memory interface comprises one of a double-data rate (DDR) memory interface, a low-power double data rate (LPDDR) memory interface, a graphics double data rate (GDDR) memory interface or a compute express link (CXL) memory interface.

20. The chiplet-based MCM of claim 18, wherein:
the communications fabric comprises a network-on-chip (NoC) circuit.

21. The chiplet-based MCM of claim 18, wherein:
the first memory-agnostic interface and the second memory-agnostic interface collectively occupy a beachfront length portion associated with the first IC chiplet; and
wherein the second port comprising the first memory interface and the fourth port comprising the second memory interface collectively occupy a length that is larger than the beachfront length portion.

22. The chiplet-based MCM of claim 18, wherein:
the first memory interface is of a first type; and
the second memory interface is of a second type that is different than the first type.

* * * * *